US010220603B2

(12) United States Patent
Landru

(10) Patent No.: US 10,220,603 B2
(45) Date of Patent: Mar. 5, 2019

(54) METHOD FOR SEPARATING A LAYER FROM A COMPOSITE STRUCTURE

(75) Inventor: Didier Landru, Champ Pres Froges (FR)

(73) Assignee: Soitec, Bernin (FR)

(*) Notice: Subject to any disclaimer, the term of this patent is extended or adjusted under 35 U.S.C. 154(b) by 183 days.

(21) Appl. No.: 14/346,238

(22) PCT Filed: Jul. 18, 2012

(86) PCT No.: PCT/IB2012/001406
§ 371 (c)(1),
(2), (4) Date: Mar. 20, 2014

(87) PCT Pub. No.: WO2013/011372
PCT Pub. Date: Jan. 24, 2013

(65) Prior Publication Data
US 2014/0326416 A1 Nov. 6, 2014

(30) Foreign Application Priority Data

Sep. 20, 2011 (FR) ...................................... 11 58331

(51) Int. Cl.
*B32B 43/00* (2006.01)
*H01L 21/762* (2006.01)
(Continued)

(52) U.S. Cl.
CPC ...... *B32B 43/006* (2013.01); *H01L 21/76251* (2013.01); *H01L 21/76254* (2013.01);
(Continued)

(58) Field of Classification Search
CPC . B32B 38/10; B32B 43/006; Y10T 156/1158; Y10T 156/1917; H01L 21/00
See application file for complete search history.

(56) References Cited

U.S. PATENT DOCUMENTS 5,476,566 A * 12/1995 Cavasin .................... 156/249
7,507,312 B2 * 3/2009 Bossi et al. ............... 156/714
(Continued)

FOREIGN PATENT DOCUMENTS

| CN | 1145215 C | 4/2004 |
| CN | 1238898 C | 1/2006 |
| WO | 2011073716 A1 | 6/2011 |

OTHER PUBLICATIONS

International Search Report for International Application No. PCT/IB2012/001406 dated Sep. 5, 2012, 3 pages.
(Continued)

*Primary Examiner* — Philip C Tucker
*Assistant Examiner* — Nickolas R Harm
(74) *Attorney, Agent, or Firm* — TraskBritt

(57) ABSTRACT

The disclosure relates to a method for separating a layer from a composite structure, the structure comprising a composite stack formed from at least a support substrate, which is partially transparent at a determined wavelength, the layer to be separated and a separation layer interposed between the support substrate and the layer to be separated, the method comprising irradiation of the separation layer through the support substrate by means of incident light ray at the determined wavelength in order to induce weakening or separation by exfoliation of the separation layer, the light ray being inclined so as to form an angle of incidence $\Theta$ such that $\Theta > \Theta_{min}$, where $\Theta_{min} = \sin_{-1}(("1/n_0)\sin(\tan^{-1}(s/2h)))$, n1 and n0, respectively, being the refractive index of the support substrate and the refractive index of the external medium in contact with the support substrate, from which the ray comes, S being the width of the ray and h being the thickness of the support substrate.

15 Claims, 2 Drawing Sheets

(51) Int. Cl.
*B32B 38/10* (2006.01)
*H01L 21/00* (2006.01)

(52) U.S. Cl.
CPC ....... *B32B 38/10* (2013.01); *B32B 2310/0806* (2013.01); *H01L 21/00* (2013.01); *Y10T 156/1158* (2015.01)

(56) References Cited

U.S. PATENT DOCUMENTS

| | | |
|---|---|---|
| 8,038,839 B2 * | 10/2011 | Noda et al. .................. 156/712 |
| 8,181,688 B2 * | 5/2012 | Johnson et al. .............. 156/752 |
| 2004/0110395 A1 | 6/2004 | Ueda et al. |
| 2006/0030122 A1 | 2/2006 | Shimoda et al. |
| 2010/0224320 A1 * | 9/2010 | Tsai et al. .................... 156/344 |
| 2011/0290413 A1 * | 12/2011 | Dang ................ B23K 26/0823 156/247 |

OTHER PUBLICATIONS

International Written Opinion for International Application No. PCT/IB2012/001406 dated Sep. 5, 2012, 5 pages.
International Preliminary Report on Patentability for International Application No. PCT/IB2012/001406 dated Jan. 21, 2014, 6 pages.
Chinese First Search for Chinese Application No. 201280045524 dated Dec. 27, 2015, 1 page.
Chinese First Office Action for Chinese Application No. 201280045524 dated Jan. 4, 2016, 9 pages.
French Preliminary Search Report for French Application No. 1158331, dated Feb. 9, 2012, 2 pages.

* cited by examiner

METHOD FOR SEPARATING A LAYER FROM A COMPOSITE STRUCTURE

CROSS-REFERENCE TO RELATED APPLICATIONS

This application is a national phase entry under 35 U.S.C. § 371 of International Patent Application PCT/IB2012/001406, filed Jul. 18, 2012, designating the United States of America and published in English as International Patent Publication WO2013/011372 A1 on Jan. 24, 2013, which claims the benefit under Article 8 of the Patent Cooperation Treaty to France Application Serial No. 1158331, filed Sep. 20, 2011, the disclosure of each of which is hereby incorporated herein in its entirety by this reference.

BACKGROUND

The disclosure concerns the field of the fabrication of composite (or multilayer) semiconductor structures, and relates more particularly to methods of separation by exfoliation making it possible to detach one or more layers of a composite structure, for example, in the scope of transferring layers from an initial support to a final support.

In the field of the fabrication of composite structures, it is often useful to be able to assemble and/or separate films or layers, such as, for example, semiconducting or insulating layers. Such separations are in particular necessary in order to transfer a layer from an initial substrate to a final substrate. These transfers are carried out, for example, during the implementation of three-dimensional component technology, which involves the formation of electronic, photovoltaic and/or optoelectronic components on both faces ("front face" and "rear face") of the same layer (3D integration). Layer transfers are also carried out in order to transfer circuits during the fabrication of rear-face illuminated imagers. The transfer of layers is also useful for changing the substrate on which one or more layers are formed, so that the new substrate meets requirements in terms particularly of cost, physical characteristics (cell size, thermal stability . . . ), etc.

A method of thin-film transfer is described, for example, in patent document EP 0 858 110. This method provides in particular the separation of a film with the aid of a technique of separation by exfoliation, this technique requiring in particular irradiation of a composite structure through a transparent substrate.

An exemplary embodiment of a method for fabricating a composite structure (steps S1 and S2) and of a method of separation by exfoliation (steps S3 and S4) will now be described with reference to FIG. 1.

First, a so-called separation layer 10 (or optical absorption layer) is assembled by bonding on one of the faces of a support substrate 5 (step S1). The support substrate 5 is at least partially transparent at a predetermined wavelength.

A layer 15 (also referred to as "layer to be separated") is subsequently assembled by bonding on the face of the layer 10 on the opposite side from the one in contact with the support substrate 5, so as to obtain a composite structure 25 (step S2).

It will be noted that the assembly of the layers 5, 10 and 15 during steps S1 and S2 may be carried out by means of any suitable assembly technique, such as, for example, a technique of molecular adhesion bonding or involving an intermediate bonding layer.

Furthermore, the layers 10 and 15 are not necessarily assembled by bonding in order to form the composite structure 25. As a variant, at least one of the layers 10 and 15 may be formed by means of a suitable deposition technique. The separation layer 10 may, for example, be formed by PECVD ("plasma enhanced chemical vapor deposition") or LPCVD ("low pressure CVD") deposition.

Once the composite structure 25 has been formed, separation of the separation layer 10 may be carried out by exfoliation. This method makes it possible to detach the layer 15 from the support substrate 5.

To this end, the separation layer 10 is irradiated by means of electromagnetic radiation 20 through the support substrate 5 (step S3). The radiation 20 is at a wavelength for which the support substrate 5 is at least partially transparent. Here, "partially transparent" is intended to mean a substrate whose transmittance at the wavelength in question is at least 10%, and preferably greater than or equal to 50%. As indicated below, the required level of transparency will vary according to the amount of energy of the electromagnetic radiation 20, which is received by the separation layer 10.

During this irradiation step S3, the separation layer 10 absorbs the incident light passing through the interface 8 between the support substrate 5 and the separation layer 10. This irradiation leads to a reduction or elimination of the adhesion forces between the atoms or molecules in the material of the separation layer 10. This is because, under the action of the radiation 20, the material constituting the separation layer 10 is subjected to photochemical and/or thermal excitation which leads to the breaking of a chain of atoms or molecules. These breaks, thus, cause separation of the separation layer 10 by exfoliation, either in the actual thickness of the layer 10 (so-called "internal" exfoliation) or at the interface 8 between the layer 10 and the support substrate 5 or at the interface 12 between the layer 10 and the layer 15 to be separated ("interfacial" exfoliation). This exfoliation phenomenon may also involve one or more gases released by the material of the separation layer 10 under the action of the radiation 20.

It should be noted that the separation induced by the radiation 20 does not necessarily lead to detachment or actual separation in the separation layer 10 (or at one of the interfaces 8 and 12), but may simply lead to weakening of the material of the separation layer 10. In the latter case, the application of additional energy (for example, in the form of mechanical forces) is necessary in order to obtain the actual detachment between the support substrate 5 and the layer 15 (if such detachment is actually desired).

Once the substrate 5 and the layer 15 have been fully separated (step S4), the support substrate 5 may be recycled with a view to forming a new composite structure.

Currently, the composite structures produced according to the layout of FIG. 1 generally have one of the following compositions:

$GaN/Al_2O_3$, which corresponds to a separation layer 10 consisting of GaN and a support substrate 5 consisting of sapphire;

$Si_3N_4/Al_2O_3$, which corresponds to a separation layer 10 consisting of $Si_3N_4$ and a support substrate 5 consisting of sapphire.

As regards these compositions, the results in terms of quality of separation by exfoliation are in general satisfactory. When layers of GaN deposited on a sapphire substrate are separated, for example, the application of the radiation 20 (at a wavelength of typically between 190 nm and 250 nm) takes place under good conditions and the separation is obtained without any particular difficulty.

The Applicant has, however, observed that the results can be significantly degraded when this separation method is applied to other compositions of the composite structure 25. For example, the separation by exfoliation is much more difficult for a composite structure 25 of the SiO$_2$/Si type (i.e., silicon dioxide on silicon). The Applicant has observed large variations in terms of quality of separation by exfoliation as a function of the batches studied and, in general, less uniform separations requiring more exposure to radiation.

There is therefore currently a need for a method of separation by exfoliation giving better results in terms of quality, effectiveness and uniformity, both for conventional composite structures and for composite structures of unconventional composition.

SUMMARY OF THE INVENTION

To this end, the present disclosure relates to a method for separating a layer from a composite structure, the composite structure comprising a composite stack formed from at least:
  a support substrate formed from a material which is at least partially transparent at a determined wavelength;
  the layer to be separated; and
  a separation layer interposed between the support substrate and the layer to be separated, the method comprising irradiation of the separation layer through the support substrate by means of at least one incident light ray at the determined wavelength in order to induce weakening or separation by exfoliation of the separation layer,
  wherein the incident light ray is inclined so as to form an angle of incidence θ such that θ≥θ$_{min}$, wherein $$\theta_{min} = \sin^{-1}\left(\left(\frac{n_1}{n_0}\right)\sin\left(\tan^{-1}\left(\frac{L}{2h}\right)\right)\right),$$

in which n1 and n0 are respectively the refractive index of the support substrate and the refractive index of the external medium in contact with the support substrate, from which the ray comes, L being the width of the said ray and h being the thickness of the support substrate through which the ray passes.

The inclination of the light ray, according to the disclosure, advantageously makes it possible, during the method of separation by exfoliation, to limit or avoid the optical interactions in the thickness of the support substrate between the incident rays, on the one hand, and the rays reflected by the interface between the support substrate and the separation layer, on the other hand.

The method of the disclosure, thus, makes it possible to reduce, or even prevent, the optical interference between incident rays and reflected rays within the support substrate. The reduction or elimination of this optical interference advantageously makes it possible to reduce the variations in actually transmitted energy as a function of the thickness of the support substrate during the method of separation by exfoliation, because the interference may be destructive. The disclosure furthermore makes it possible to maximize the amount of energy actually transmitted into the separation layer.

The quality and reproducibility of the separation by exfoliation between the support substrate and the layer to be separated are thus greatly improved. The disclosure makes it possible in particular to carry out separations by exfoliation on composite structures, which have compositions different from those generally used and which are particularly sensitive to optical interference.

In a particular embodiment, the angle of incidence θ is such that θ≤θ$_{max}$, where θmax is defined in the following way:

$$\theta_{max} = \tan^{-1}\left(\frac{n_1}{n_0}\right).$$

In other words, the maximum limit θmax is equal to the Brewster angle.

The Brewster angle defines the maximum limit of the angle of incidence θ, beyond which all of the light intensity of the incident ray is reflected on the exposed surface of the support substrate.

As indicated in more detail below, this embodiment is feasible only if θmax>θmin. This embodiment makes it possible to maximize the amount of light energy actually transmitted to the separation layer during the irradiation step.

Furthermore, the support substrate may consist of silicon and the separation layer may consist of silicon dioxide.

BRIEF DESCRIPTION OF THE DRAWINGS

Other characteristics and advantages of the present disclosure will become apparent from the description given below with reference to the appended drawings, which illustrate an exemplary embodiment thereof implying no limitation. In the figures.

DETAILED DESCRIPTION

The present disclosure relates to a separation method making it possible to detach or weaken, by exfoliation, a layer to be separated from a composite structure of conventional or unconventional composition.

The Applicant has carried out a study which has made it possible to demonstrate the physical mechanism giving rise to the difficulties encountered for carrying out a method of separation by exfoliation. The study has in particular demonstrated the role of the optical interference occurring in the support substrate during the irradiation of the composite structure.

Figure 1:
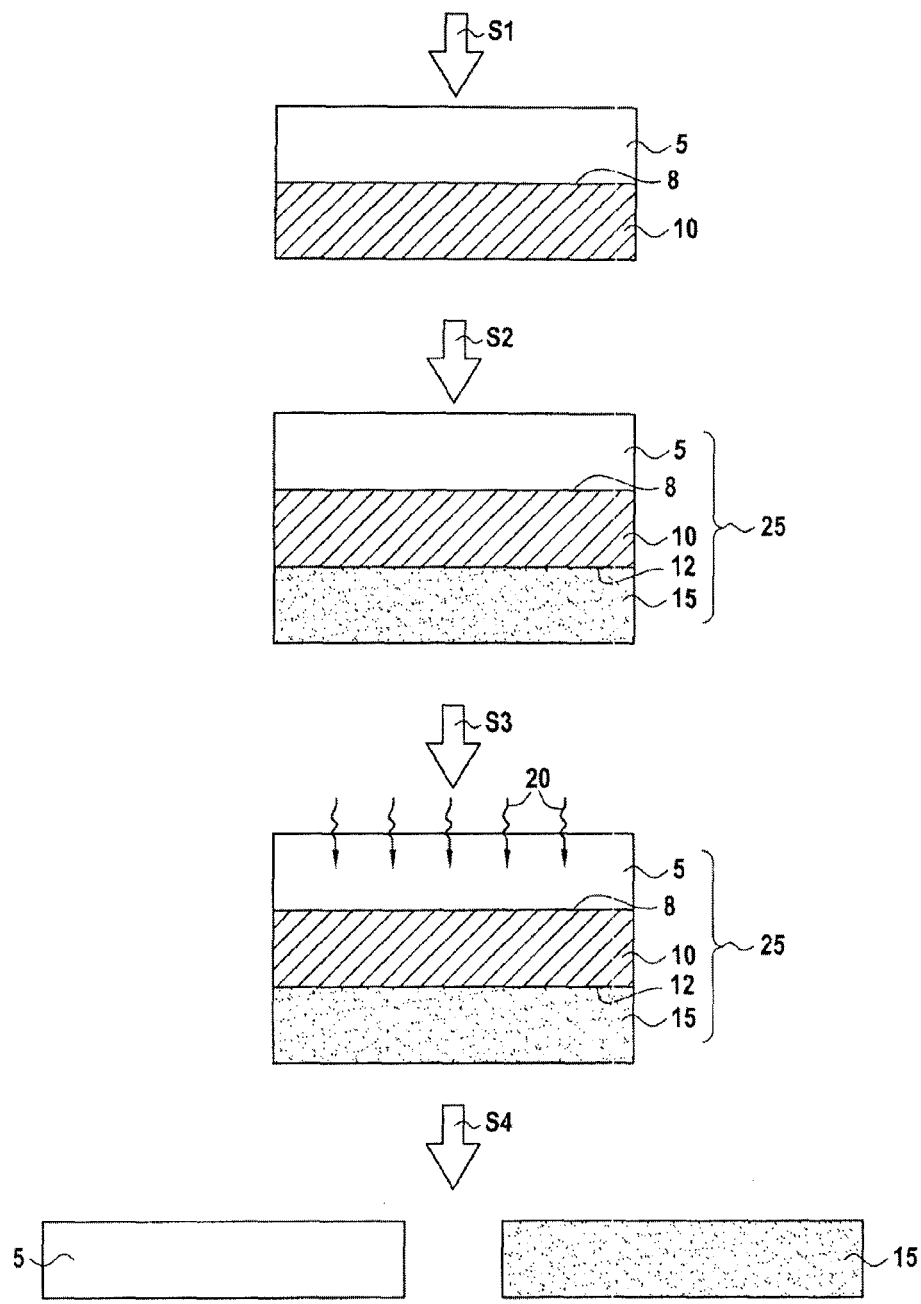
FIG. 1 schematically represents a known method for fabricating a composite structure, as well as a method of separation by exfoliation applied to the said structure.

This mechanism will now be described with reference to FIG. 2. This figure represents the composite structure 25, as described above, with reference to FIG. 1.

Figure 2:
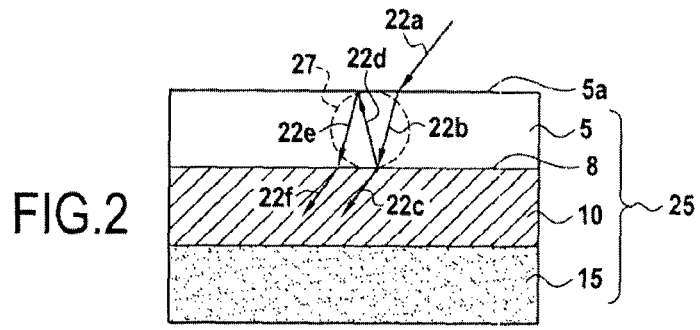
FIG. 2 schematically illustrates the mechanism of the creation of optical interference in the support structure of a composite structure.

FIG. 2 represents in particular an incident light ray 22a reaching the exposed surface 5a of the support substrate 5 during the irradiation step S3. As for any light ray encountering a semi-absorbent medium, a part (not represented) of the light ray 22a is reflected at the upper surface 5a of the substrate 5 while a part of the ray 22b is transmitted into the support substrate 5. During its passage through the thickness of the support substrate 5, a part of the transmitted ray 22b is absorbed and the remaining part reaches the interface 8 between the support substrate 5 and the separation layer 10. The interface 8 again functions as an optical diopter so that the ray 22*b* is partially reflected (reflected ray 22*d*) and the remaining part 22*c* is transmitted into the separation layer 10. The reflected ray 22*d* again encounters the upper surface 5*a* and leads to new processes of internal reflection within the support substrate 5.

However, the various light rays (22*b*, 22*d*, 22*e* . . . ) passing through the thickness of the support substrate 5 interact with one another in order to create, depending on their phase shift, waves with higher intensities (this is referred to as constructive interference) or waves with lower intensities (this is referred to as destructive interference). These interference phenomena give rise to the strong variations and significant reductions observed by the Applicant in relation to the radiative energy transmitted by the support substrate to the separation layer.

More particularly, the studies have shown that the level of the interference depends strongly on the jumps in the optical index (or refractive index), which are encountered by the radiation at the exposed surface 5*a* and at the interface 8. Ideally, the optical index difference between the various materials involved should be minimized. As regards, the compositions of conventional composite structures (namely, $GaN/Al_2O_3$ or $Si_3N_4/Al_2O_3$), the situation is particularly favorable since the index jumps are at most 0.87 for radiation with a wavelength of between 150 nm and 300 nm (the optical indices of sapphire and $Si_3N_4$ being 1.87 and 2.27, respectively).

On the other hand, the situation is much less favorable for an $SiO_2/Si$ composition in which the optical index of silicon dioxide and silicon, respectively, rise to 1.992 and 3.42 for radiation having a wavelength of more than 1.5 µm. If the exposed surface 5*a* is in contact with air (with an index equal to 1), then, for example, very large jumps in optical index are obtained (of the order of 2.4 or 1.4 between each of the layers) for radiation with a wavelength of 9.3 µm. These large jumps in optical index contribute to generating very strong variations in the light intensity transmitted to the separation layer 10 during step S3.

Furthermore, the level of sensitivity to interference in relation to the thickness of the support substrate is extreme in the above case of a separation layer consisting of silicon dioxide and a support substrate consisting of silicon. Specifically, a maximum transmitted intensity is observed with a silicon thickness period of 1.35 µm. In other words, when considering a thickness L of the support substrate consisting of silicon for which a transmission maximum is reached, a transmission minimum will in principle be obtained for a thickness L+1.35/2 µm and a new transmission maximum will be reached for a thickness L+1.35 µm. This means that it would be necessary to control the thickness of the support substrate consisting of silicon with a level of precision much better than 0.675 µm in order to avoid significant variations in transmission of the radiation into the separation layer. Such a level of control is not currently envisageable for support substrates consisting of silicon, the thickness of which generally varies with an amplitude of the order of 5 µm and 1.5 µm for a wafer diameter of 200 mm and 300 mm, respectively, (Total Thickness Variation or "TTV").

The level of control over the thickness for substrates such as those consisting of silicon is therefore insufficient, which contributes to the problem of the variations in transmitted energy as explained above.

The problems of transmission and optical interference have not hitherto been dealt with effectively, in particular because they have a limited impact on composite structures of traditional composition. The Applicant has therefore developed a new separation method making it possible to overcome the aforementioned drawbacks, and to do so irrespective of the composition of the composite structure in question.

A separation method, according to one embodiment of the disclosure, will now be described with reference to FIGS. 3A and 3B.

Figure 3A:
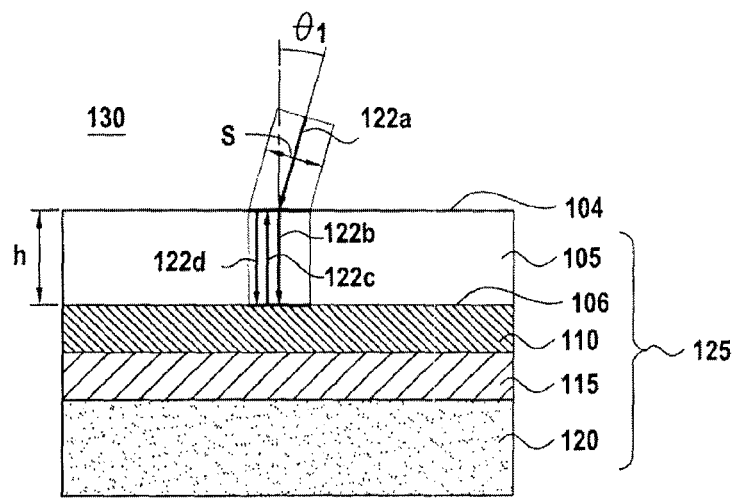
FIGS. 3A and 3B schematically represent a method of separation by exfoliation, according to a particular embodiment of the disclosure, applied to a composite structure.
Figure 3B:
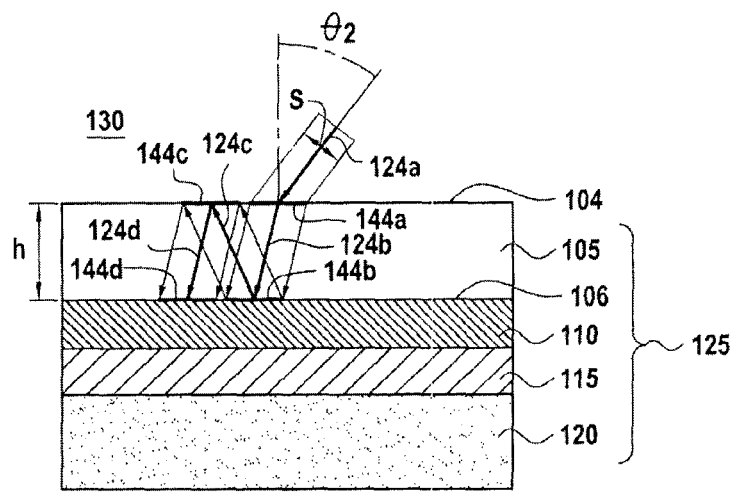

More precisely, FIGS. 3A and 3B represent a composite structure 125 comprising the following composite stack:
  a support substrate 105 formed from a material which is at least partially transparent at a determined wavelength, denoted λ;
  a layer 115 to be separated; and
  a separation layer 110 interposed between the support substrate 105 and the layer 115 to be separated.

The separation layer 110 and the layer 115 to be separated may be produced by any suitable deposition technique (for example, by PECVD or LPCVD deposition) or any other suitable layer formation technique. It is also conceivable to assemble at least one of these layers by bonding.

It is possible to detach the layer 115 from the support substrate 105 by separating the separation layer 110 by exfoliation. It will be noted that the composite structure 125 may be subjected to complementary technology steps before the method of separation by exfoliation is carried out. One or more layers may, in particular, be formed or assembled on the exposed face of the layer 115 (for example, a final substrate), optionally after technology steps have been carried out on the rear face of the layer 115 (formation of components, etc.).

In the example described here, a final substrate 120 is furthermore formed (for example, by bonding or deposition) on the exposed face of the layer 115 to be separated (i.e., on the face on the opposite side from the one in contact with the separation layer 110).

According to the separation method of the disclosure, electromagnetic radiation is applied in the form of a light beam onto the support substrate 105 of the composite structure 125. The Applicant has surprisingly observed that it is possible to substantially improve the effectiveness of a method of separation by exfoliation applied to the composite structure 125, by influencing the inclination of the light beam projected onto the support substrate 105.

During the irradiation step, the incident beams 122*a* and 124*a* strike the surface 104 of the support substrate 105 at an angle of incidence, respectively, denoted θ1 and θ2, defined with respect to the normal to the surface 104 (cf. FIGS. 3A and 3B, respectively).

The incident beams 122*a* and 124*a* have a wavelength λ at which the support substrate 105 is at least partially transparent. At this wavelength, the substrate 105 has a transmittance of at least 10%, and preferably greater than or equal to 50%. It is, however, possible to compensate for a low transmittance by increasing the amount of energy of the beam applied during the irradiation step (for example, by focusing the beam).

It will be noted that the support substrate and each of the layers forming the composite structure 125 may consist of two or more sublayers. In particular, the separation layer 110 may comprise a first so-called heating sublayer (for example, consisting of silicon dioxide) and a second so-called exfoliation sublayer (for example, consisting of $Si_3N_4$). The function of the heating sublayer is to induce heating under the effect of the irradiation. The function of the exfoliation sublayer is to lead to separation of the separation layer 110 by exfoliation under the effect of the heat energy transmitted from the heating sublayer (by thermal conduction). The exfoliation sublayer is adapted to decompose or weaken under the effect of the heating induced by the heating sublayer during the irradiation.

In a variant, the separation layer 110 comprises at least one sublayer, which simultaneously fulfills the functions of heating and exfoliation.

As for any light ray encountering a semi-absorbent medium, a part (not represented) of the light beam 122a (and 124a, respectively) is reflected by the exposed surface 104 of the support substrate 105, while a part of the beam 122b (and 124b, respectively) is transmitted into the support substrate 105. During its passage through the thickness of the support substrate 105, a part of the transmitted beam 122b (and 124b, respectively) is absorbed and the remaining part reaches the interface 106 between the support substrate 105 and the separation layer 110. The interface 8 again functions as an optical diopter so that the beam 122b (and 124b, respectively) is partially reflected in the form of a reflected beam 122c (and 124c, respectively). The reflected beam 122c (and 124c, respectively) again encounters the upper surface 104 and leads to new processes of internal reflection within the support substrate 105.

Conventionally, when a method of separation by exfoliation is being carried out, the incident beam is applied onto the surface of the composite structure with a very small angle of incidence θ with respect to the normal to the surface. As a general rule, the beam is projected perpendicularly onto the surface of the support substrate. However, in order for there to be optical interference in the thickness of the support substrate 105, it is necessary for the beam reflected by the interface 106 to be able to interact with the incident beam transmitted into the substrate 105. The Applicant has observed that, by inclining the incident beam sufficiently with respect to the surface 104 of the support substrate 105, it is possible to reduce or fully eliminate the optical interference giving rise to the problems of variation and/or limitation of the energy, which is actually transmitted to the separation layer during the irradiation step.

According to the disclosure, the angle of incidence θ at which the incident beam is applied onto the support substrate should be such that:

$\theta \geq \theta_{min}$, the threshold value $\theta_{min}$ being defined in the following way:

$$\theta_{min} = \sin^{-1}\left(\left(\frac{n_1}{n_0}\right)\sin\left(\tan^{-1}\left(\frac{S}{2h}\right)\right)\right),$$

wherein n1 and n0 are, respectively, the refractive index of the support substrate 105 and the refractive index of the external medium 130 in contact with the support substrate, from which the said ray (or beam) comes, S being the width of the ray (or size of the "spot") and h being the thickness of the support substrate.

In the first example, represented in FIG. 3A, the angle of incidence θ1 at which the incident beam 122a is applied is such that θ1<θmin. In this example, the transmitted beam 122b and the reflected beam 122c overlap almost completely, so that they can interact throughout the thickness of the support substrate 105. Consequently, significant optical interference is liable to occur during the irradiation step of the separation method.

In the case of FIG. 3B, conversely, the incident beam 124a is inclined so that the angle of incidence θ2 satisfies the condition θ2≥θmin. In this case, the incidence surfaces 144a and 144c, respectively, formed by the beams 124a and 124c on the exposed surface 104 are not superimposed. Likewise, the incidence surfaces 144b and 144d formed by the beams 124b and 124d on the interface 106 are not superimposed.

The inclination of the light ray, according to the disclosure, advantageously makes it possible, during the method of separation by exfoliation, to limit or avoid the optical interactions in the thickness of the support substrate between the various optical beams involved (i.e., the beams 124b, 124c, 124d and all the subsequent internal reflections).

The method of the disclosure, thus, makes it possible to reduce, or even prevent, any optical interference between incident rays and reflected rays within the support substrate. The reduction or elimination of this optical interference advantageously makes it possible to reduce the variations in the energy actually transmitted to the separation layer 110 as a function of the thickness of the support substrate 105 during the method of separation by exfoliation. The disclosure, furthermore, makes it possible to maximize the amount of energy actually transmitted into the separation layer 110.

The quality and reproducibility of the separation by exfoliation between the support substrate 105 and the layer 115 to be separated are thus greatly improved. The disclosure makes it possible, in particular, to carry out separations by exfoliation on composite structures, which have compositions different from those generally used and which are particularly sensitive to optical interference.

As indicated with reference to the composite structure 25, the separation induced by the beam 124a does not necessarily lead to detachment or actual separation in the separation layer 110, but may simply lead to weakening of the material of the separation layer 110, requiring the subsequent application of additional energy (for example, in the form of mechanical forces) in order to obtain the actual detachment between the support substrate 105 and the layer 115.

Once the substrate 105 and the layer 115 have been fully separated, the support substrate 105 may be recycled with a view to forming a new composite structure.

In a first example, it is assumed that:
the support substrate 105 consists of silicon with an optical index n1=3.42 and a thickness h=775 μm,
the separation layer 110 consists of silicon dioxide,
the wavelength λ of the incident beam is 9.3 μm,
the external medium 130 in which the composite structure 125 is placed is air, the refractive index n0 of which is such that n0=1, and
the width S of the beam is such that S=120 μm.

A threshold value θmin=17.9177° is then obtained, i.e., of the order of 18°.

In this case, the separation method may, for example, be configured so that θ2=18°, 19° or 20°.

In a second example, it is assumed that:
the support substrate 105 consists of sapphire with an optical index n1=1.87 and a thickness h=430 μm,
the separation layer 110 comprises a heating sublayer consisting of silicon dioxide and an exfoliation sublayer consisting of $Si_3N_4$,
the wavelength λ of the incident beam is 9.3 μm,
the external medium 130 in which the composite structure 125 is placed is air, the refractive index n0 of which is such that n0=1, and
the width of the incident beam is S=120 μm.

A threshold value θmin=83° is then obtained. However, if the angle of incidence θ2 of the incident beam 124a satisfies the condition θ2≥θmin, the angle θ2 exceeds the angle limit referred to as the Brewster angle, i.e., the maximum angle limit for which all the light intensity of the incident beam 124a is reflected by the surface 104 of the support substrate 105. The Brewster angle is defined in the following way:

$$\theta_S = \tan^{-1}\left(\frac{n_1}{n_0}\right)$$

In the second example above (support substrate consisting of sapphire), the Brewster $\theta_B$ angle is 62°. The following situation is therefore encountered:

$\theta min > \theta_B$.

Consequently, in this particular case it is not possible to set the angle of incidence θ so that $\theta \geq \theta_{min}$ and $\theta < \theta_B$. In other words, in this example it is not possible to overcome the optical interference by influencing the angle of incidence of the beam. It is nevertheless possible to set the angle of incidence so as to be slightly less than $\theta_B$ (for example, of the order of 60°) in order to reduce the level of optical interference in the support substrate as much as possible.

In a particular embodiment of the disclosure, the angle of incidence θ of the optical beam therefore satisfies the following condition: $\theta < \theta_B$. This embodiment makes it possible to maximize the amount of light energy actually transmitted to the separation layer during the irradiation step. As indicated above, however, this embodiment is feasible only if $\theta min < \theta_B$.

The invention claimed is:

1. A method for separating a layer from a composite structure, the method comprising:
   providing a composite structure including a support substrate comprising a material at least partially transparent to a ray of electromagnetic radiation having a determined wavelength, the layer to be separated, and a separation layer interposed between the support substrate and the layer to be separated;
   providing an external medium in contact with an upper surface of the support substrate;
   determining a refractive index ($n_1$) of the support substrate;
   determining a refractive index ($n_0$) of the external medium;
   determining a thickness (h) of the support substrate;
   using the equation $\theta=\sin^{-1}((n_1/n_0)\sin(\tan^{-1}(\tan^{-1}(s/2_h))))$, to determine an angle of incidence θ in which S is a width of an at least one incident ray of electromagnetic radiation to be directed at the composite structure;
   orienting the at least one incident ray of electromagnetic radiation at the separation layer and inclining the at least one incident ray of electromagnetic radiation at the angle of incidence θ relative to the upper surface of the support substrate;
   irradiating the separation layer through the support substrate with the at least one incident ray of electromagnetic radiation having the determined wavelength; and
   causing the separation layer to weaken or separate by exfoliation.

2. The method of claim 1, wherein the support substrate comprises sapphire and the separation layer comprises at least one of silicon dioxide and silicon nitride.

3. The method of claim 2, wherein the support substrate consists essentially of sapphire and the separation layer consists essentially of at least one of silicon dioxide and silicon nitride.

4. The method of claim 2, wherein the separation layer comprises silicon dioxide.

5. The method of claim 4, wherein the support substrate consists essentially of sapphire and the separation layer consists essentially of silicon dioxide.

6. The method of claim 1, wherein the angle of incidence θ is less than a Brewster angle $\theta_{max}$ wherein the Brewster angle is a maximum angle limit above which all of the at least one incident rays of electromagnetic radiation are reflected by a surface of the support substrate such that there is no penetration of the at least one incident ray into the support substrate; and the Brewster angle is determined using the equation $\theta_{max}=\tan^{-1}(n_1/n_0)$.

7. The method of claim 1, wherein the width of the at least one incident ray of electromagnetic radiation is 120 μm, the angle of incidence θ of the at least one incident ray of electromagnetic radiation is approximately 60°, the external medium is air, the separation layer comprises silicon dioxide, the support substrate comprises sapphire, and the support substrate has an optical index of 1.87 and a thickness of 430 μm.

8. The method of claim 1, wherein a width of the at least one incident ray at the surface of the support substrate does not substantially overlap with a width of a reflected ray at the surface of the support substrate.

9. The method of claim 1, wherein the width of the at least one incident ray at an interface between the support substrate and the separation layer does not substantially overlap with a width of a reflected ray at the interface between the support substrate and the separation layer.

10. A method for separating a layer from a composite structure, the method comprising:
   providing a composite structure including a support substrate comprising a material at least partially transparent to radiation having a determined wavelength, the layer to be separated, and a separation layer interposed between the support substrate and the layer to be separated;
   providing an external medium in contact with an upper surface of the support substrate;
   determining a refractive index ($n_1$) of the support substrate;
   determining a refractive index ($n_0$) of the external medium;
   determining a thickness (h) of the support substrate;
   using the equation $\theta_{min}=\sin^{-1}((n_1/n_0)\sin(\tan^{-1}(\tan^{-1}(s/2_h))))$, to determine a minimum angle of incidence ($\theta_{min}$) in which S is a width of an at least one incident ray to be directed at the composite structure;
   using the equation $\theta_{max}=\tan^{-1}(n_1/n_0)$; to determine a Brewster angle $\theta_{max}$;
   if the Brewster angle $\theta_{max}$ is equal to or greater than the minimum angle of incidence $\theta_{min}$, then orienting the at least one incident light ray at the separation layer and inclining the at least one incident light ray at the minimum angle of incidence $\theta_{min}$ relative to the upper surface of the support substrate;
   otherwise, if the Brewster angle $\theta_{max}$ is less than the minimum angle of incidence $\theta_{min}$, then orienting the at least one incident light ray at the separation layer and inclining the at least one incident light ray at between 0 and 2 degrees less than the Brewster angle $\theta_{max}$ relative to the upper surface of the support substrate;
   irradiating the separation layer through the support substrate with the at least one incident light ray having the determined wavelength; and
   causing the separation layer to weaken or separate by exfoliation.

11. The method of claim 10, wherein the support substrate comprises silicon and the separation layer comprises silicon dioxide.

12. The method of claim 11, wherein the support substrate consists essentially of silicon and the separation layer consists essentially of silicon dioxide.

13. The method of claim 10, wherein the minimum angle of incidence $\theta_{min}$ of the at least one incident ray is between 18° and 20°, the width of the at least at least one incident ray is 120 μm, the external medium is air, the separation layer comprises silicon dioxide, and the support substrate comprises silicon that has an optical index of 3.42, and a thickness of 775 μm.

14. The method of claim 10, wherein the width of the at least one incident ray at the surface of the support substrate does not overlap with a width of a reflected ray at the surface of the support substrate.

15. The method of claim 10, wherein the width of the at least one incident ray at an interface between the support substrate and the separation layer does not overlap with a width of a reflected ray at the interface between the support substrate and the separation layer.

\* \* \* \* \*